US006991455B2

(12) United States Patent
Wu (10) Patent No.: US 6,991,455 B2
(45) Date of Patent: Jan. 31, 2006

(54) SHUTTER STRUCTURE OF AN OVEN APPARATUS USED IN SEMICONDUCTOR OR LIQUID CRYSTAL DISPLAY PROCESSES

(75) Inventor: Chao-Min Wu, Miao Li (TW)

(73) Assignee: AU Optronics Corp., Hsinchu (TW)

( * ) Notice: Subject to any disclaimer, the term of this patent is extended or adjusted under 35 U.S.C. 154(b) by 62 days.

(21) Appl. No.: 10/388,527

(22) Filed: Mar. 17, 2003

(65) Prior Publication Data

US 2004/0011854 A1 Jan. 22, 2004

(30) Foreign Application Priority Data

Jul. 16, 2002 (TW) ................................ 91115863 A (51) Int. Cl.
*F27D 1/18* (2006.01)
(52) U.S. Cl. ........................................ 432/250; 49/333
(58) Field of Classification Search ................ 432/250, 432/237, 247; 110/173 R, 181; 49/333, 49/334, 335
See application file for complete search history.

(56) References Cited

U.S. PATENT DOCUMENTS

| 685,886 A | * | 11/1901 | Voegelein | .................... 110/178 |
| 6,091,056 A | * | 7/2000 | Kannan et al. | ............. 219/390 |
| 6,113,734 A | * | 9/2000 | Woo et al. | ................ 156/345.1 |

* cited by examiner

*Primary Examiner*—Gregory Wilson
(74) *Attorney, Agent, or Firm*—Troxell Law Office, PLLC (57) ABSTRACT

A shutter structure of an oven apparatus used in semiconductor or liquid crystal display (LCD) processes includes a hollow housing and an open device, wherein the housing has a front face, a first face, a second face and a rear face whose edges of two sides are respectively connected with one respective side edge of the first face and the second face, and the front face is opposite to the rear face and is structurally separable at least with the first face and with the second face, and the open device includes a rotating shaft which is disposed at one side of the front face and a driver which is disposed at one end of the rotating shaft and used to drive the front face of the shutter to open rotatedly so as to have a substrate placed into the housing and taken out from the housing.

13 Claims, 8 Drawing Sheets

FIG.7B

SHUTTER STRUCTURE OF AN OVEN APPARATUS USED IN SEMICONDUCTOR OR LIQUID CRYSTAL DISPLAY PROCESSES

FIELD OF THE INVENTION

The present invention relates to a shutter structure of an oven apparatus, more particularly, to an improved action design of a shutter structure of an oven apparatus so as to enhance the stability of the oven apparatus in temperature, to prevent pollution particles resulted from friction and impact of the shutter when moving up and down, and to increase the yield of processes.

BACKGROUND OF THE INVENTION

In a general semiconductor industry or a related industry to the liquid crystal display, a baking or pre-baking process is indispensable to the preparation of a substrate such as a wafer or a panel. The baking procedure is usually carried out before or after coating and after developing.

Figure 1:
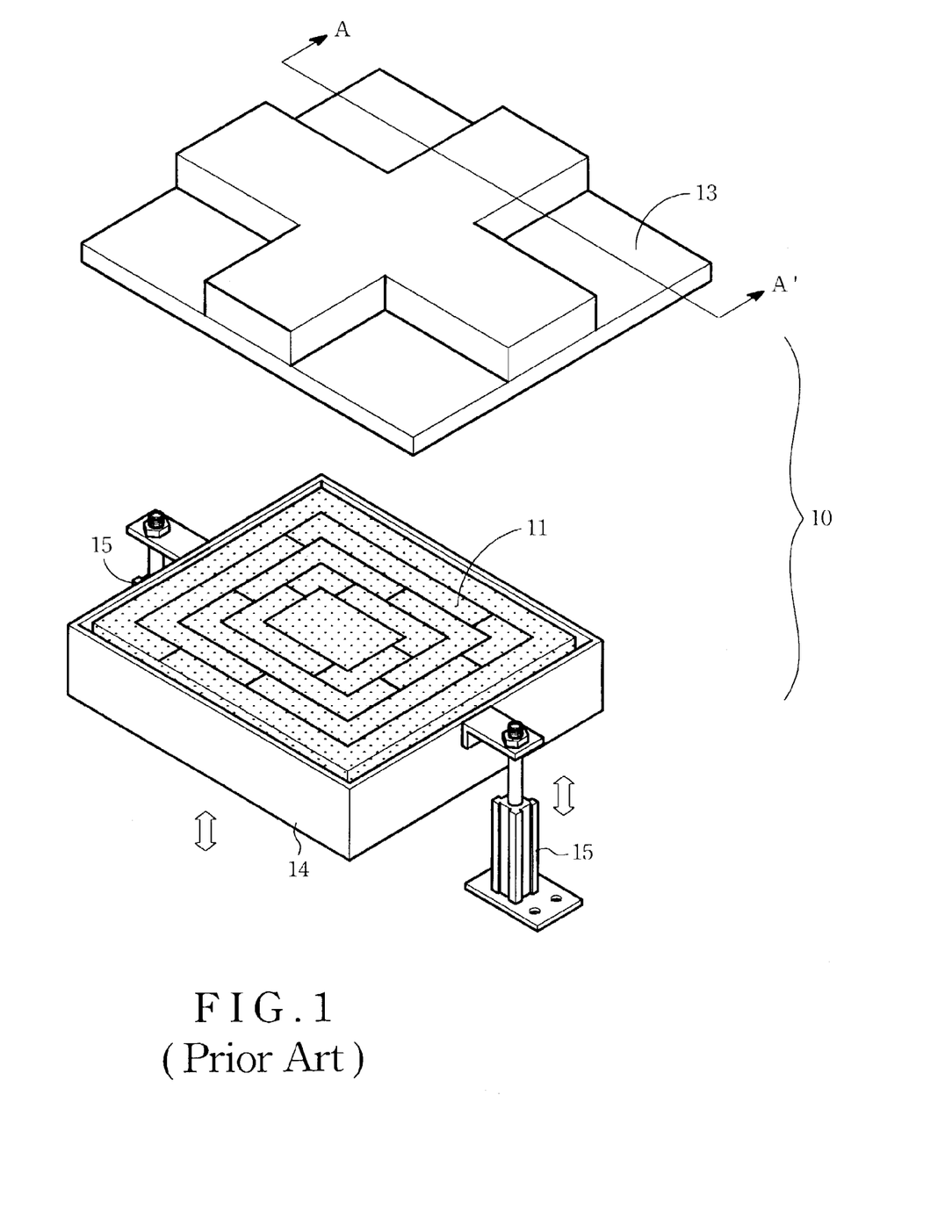
FIG. 1 is a schematic construction diagram of an oven apparatus in the prior art.
Figure 2A:
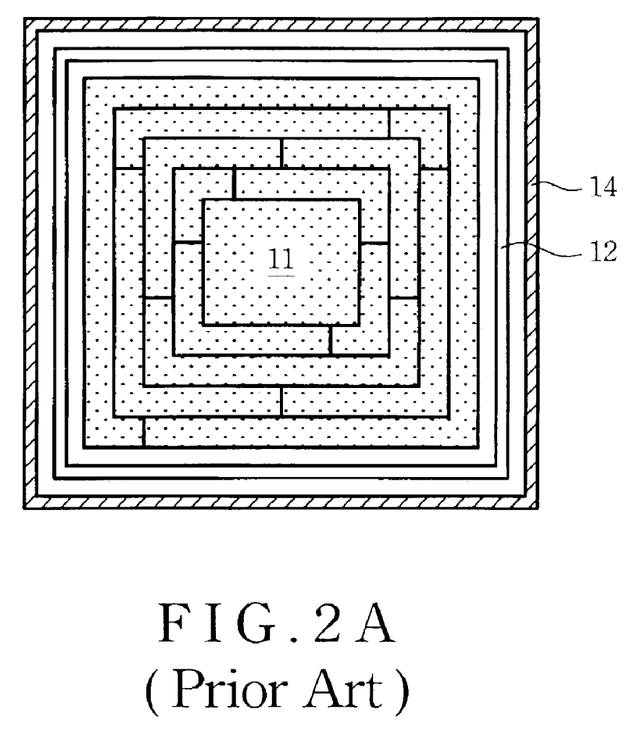
FIGS. 2A and 2B are respectively a top view of the oven apparatus in FIG. 1 under a normal condition of which the upper plate is removed and a cross-sectional view thereof along with a line AA' of FIG. 1.
Figure 2B:
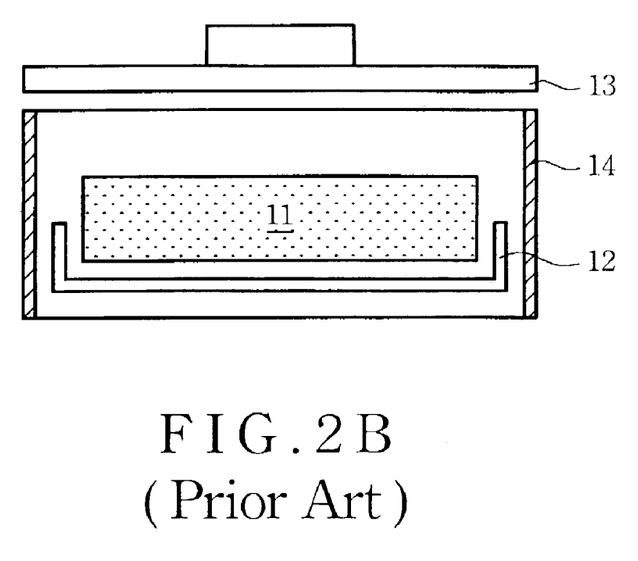

Please refer to FIGS. 1, 2A and 2B. FIG. 1 is a schematic structural diagram of a conventional oven apparatus 10 which comprises a hot plate 11, a lower plate 12 (shown in FIGS. 2A and 2B), an upper plate 13, a hollow shutter 14 and a linear air cylinder 15 of which the motion is linear. FIGS. 2A and 2B are respectively a top view of the oven apparatus 10 with the upper plate 13 removed and a cross-sectional view thereof along with a line AA' of FIG. 1, wherein the lower plate 12 below the hot plate 11 is made of stainless steel and is fixedly connected to the hot plate 11, and the hot plate 11 is placed at an appropriate position in the hollow of the shutter 14.

The shutter 14 of the conventional oven apparatus 10 is designed to move up and down in a piece, as the arrow shown in FIG. 1, so that the baking procedure can be carried out in the oven apparatus 10. When the substrate (not shown) such as a wafer or a panel is to be put into or taken out from the oven apparatus 10 by a main arm (not shown), the linear-motion air cylinder 15 which is connected with the shutter 14 and driven by a N₂ gas is firstly used to drop the shutter 14 down, and then a control sensor (not shown) which is used to monitor the location of the shutter 14 directs the main arm to put the substrate onto the hot plate 11 of the oven apparatus 10 or take it out of the hot plate 11. After the substrate is positioned or taken away, the shutter 14 is elevated to the original location by the linear air cylinder 15.

However, because the shutter 14 is moved up and down as a whole, the temperature of the oven apparatus 10 has a variation of about 2–3° C., and thus the stability of the process is affected.

Figure 3A:
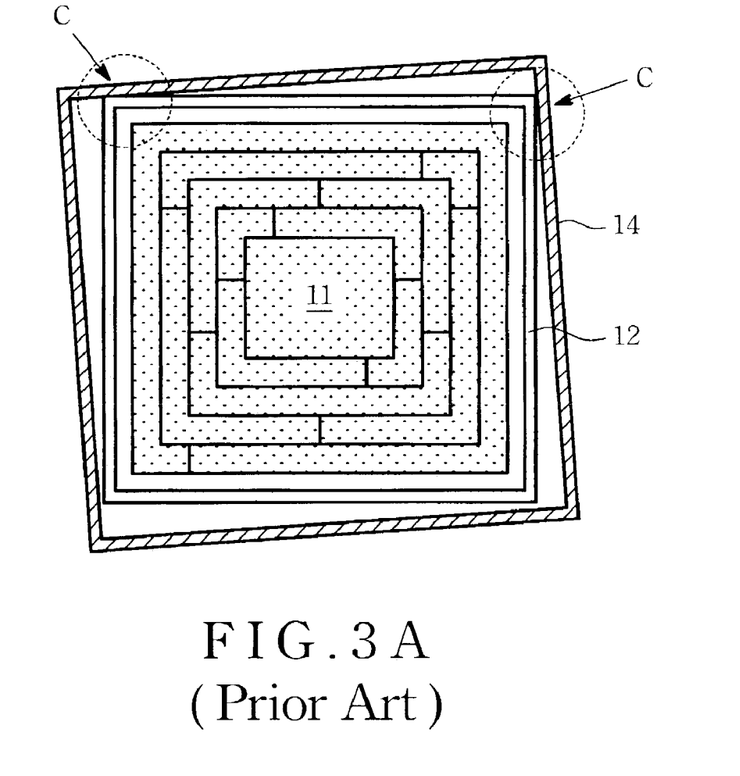
FIGS. 3A and 3B are respectively a top view of the oven apparatus in FIG. 1 under an abnormal condition of which the upper plate is removed and a cross-sectional view thereof along with a line AA' of FIG. 1.
Figure 3B:
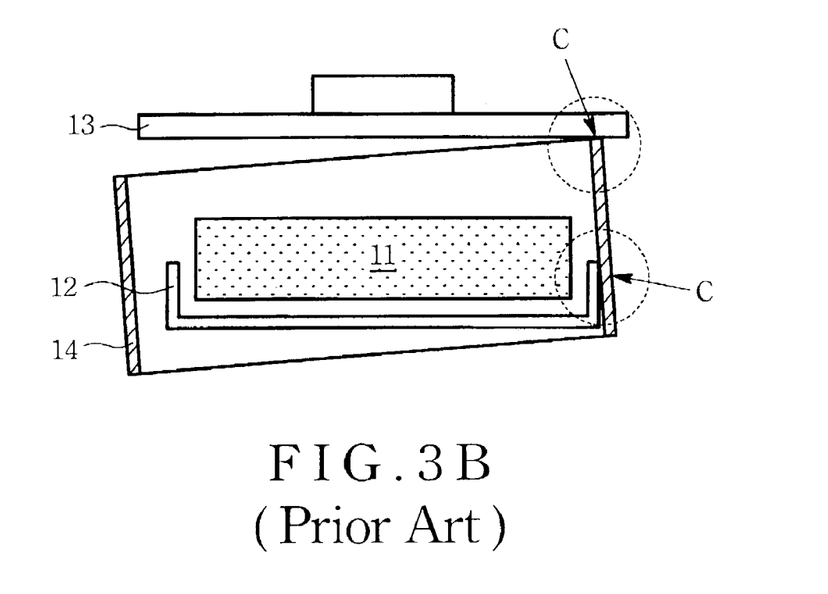

Furthermore, as shown in FIGS. 2A and 2B, under a normal condition, a gap is between the shutter 14 and the lower plate 12 as well as between the shutter 14 and the upper plate 13, respectively. However, since the shutter 14 is a hollow cuboid made by a thin stainless steel plate and has two opposite openings, the stiffness of the shutter 14 is not good and is liable to deform. That is apt to lead the shutter 14 of the conventional oven apparatus 10 in operation to rubbing against and colliding with the lower stainless steel plate 12 below the hot plate 11 as well as the upper plate above the hot plate 11, indicated by the arrows in FIGS. 3A and 3B which show an abnormal condition. The friction and collision would result in particles reducing the quality of products in the oven apparatus 10.

In addition, the shutter 14 while dropped down is also possible to have friction and impact with the fixed bases (not shown) of the lifter pins (not shown) of the oven apparatus 10, and thus pollution particles are produced and the yield of products are affected.

Therefore, an improved design of the structure of the conventional oven apparatus is desired so as to effectively solve the above-mentioned problems happened in the baking process.

SUMMARY OF THE INVENTION

The primary objective of the present invention is to provide a shutter structure of an oven apparatus, of which only one face for an entrance of the substrate takes an open and closed action so as to maintain the stability of the process temperature, and to prevent pollution particles resulted from friction and impact of the shutter in operation with the other structural elements around the oven apparatus.

In one embodiment of this invention, a shutter structure of an oven apparatus used in semiconductor or liquid crystal display (LCD) processes is disclosed. The shutter structure includes a hollow housing and an open device, wherein the housing has a front face, a first face, a second face and a rear face whose edges of two sides are respectively connected with one respective side edge of the first face and the second face, and the front face is opposite to the rear face and is structurally separable at least with the first face and with the second face, and the open device includes a rotating shaft which is disposed at one side of the front face and a driver which is disposed at one end of the rotating shaft and used to drive the front face of the shutter to open rotatedly so as to have a substrate placed into the housing and taken out from the housing.

Further, in another embodiment of this invention, the front face of the shutter has a first front face and a second front face and can be linearly or rotatedly opened.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 4A:
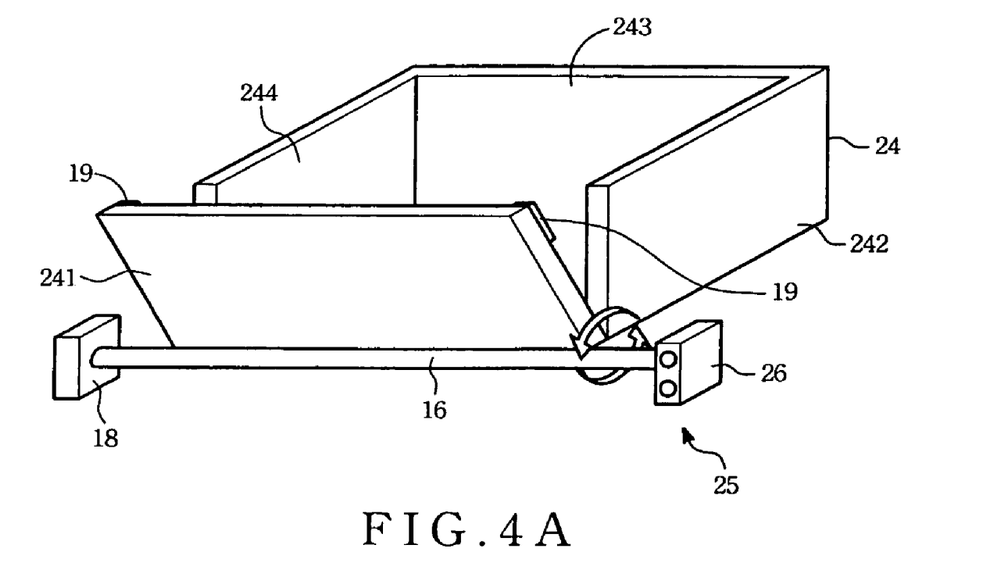
FIGS. 4A and 4B are perspective diagrams showing preferred embodiments of a shutter structure in accordance with the present invention.
Figure 5A:
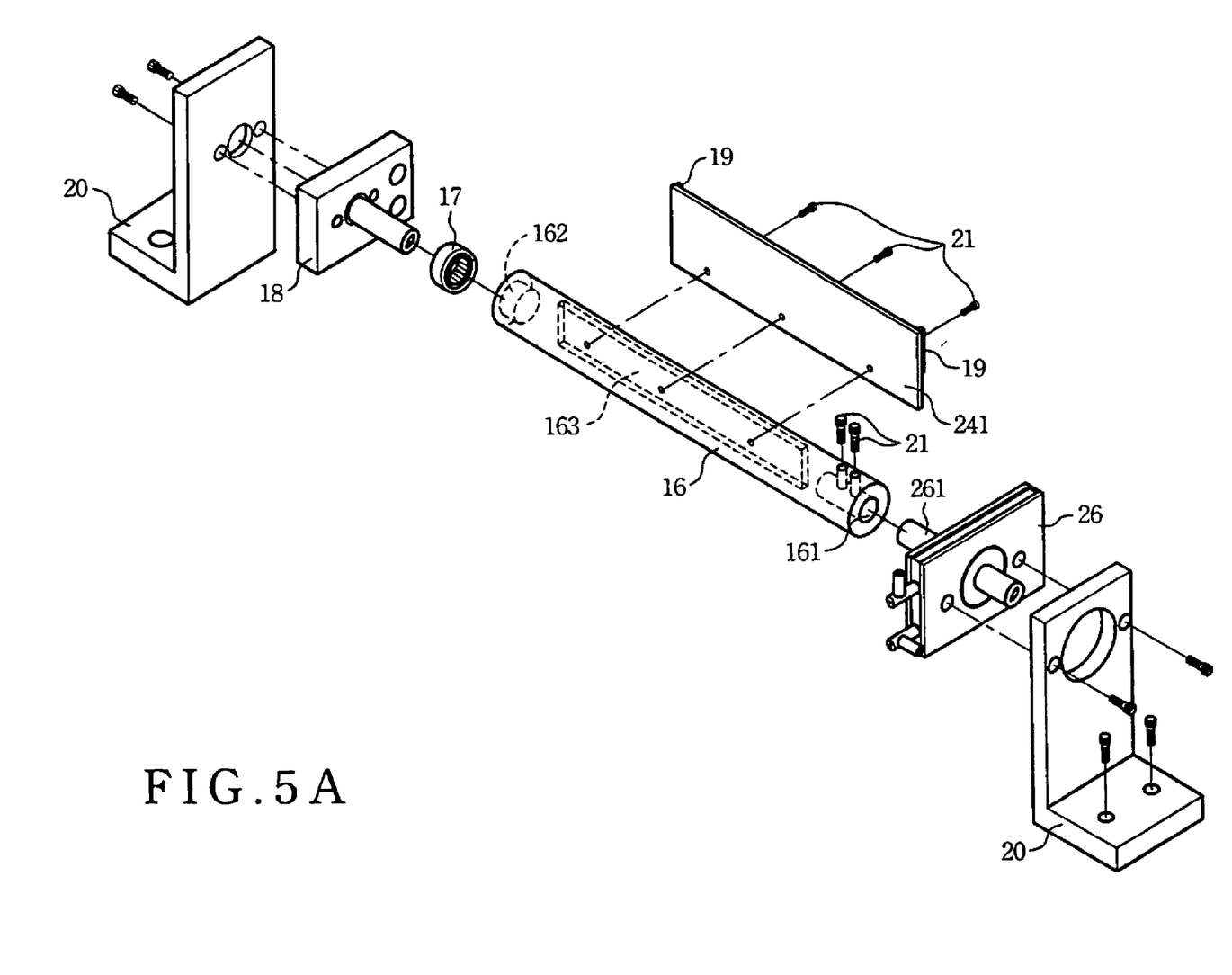
FIGS. 5A and 5B are partially exploded diagrams showing the shutter structure of FIG 4A.

Please refer to FIGS. 4A and 5A, which are respectively a schematic perspective diagram and a partially schematic exploded diagram of an improved motion structure of the shutter in a preferred embodiment of this invention. The detailed description of the present invention is given for illustration by the following best mode in which the front face of the shutter is driven by a rotative gas cylinder and is rotatedly lifted to open and close.

A shown in FIG. 4A, the shutter of the oven apparatus in accordance with the preferred embodiment of this invention includes a hollow housing 24 and an open device 25. The housing 24 includes a front face 241, a first face 242, a rear face 243 and a second face 244, wherein two sides of the rear face 243 are respectively connected with one respective side of the first face 242 and the second face 244, and the front face 241 is opposite to the rear face 243 and is structurally separable with the other faces. Referring to FIG. 4A, edges of the two sides of the front face 241 are respectively contacted with one respective side edge of the front face 241 and the second face 244 respectively opposite to the side edges thereof which are connected with the rear face 243. The front face 241 is the entrance of the wafer of LCD panel substrate (not shown) into the housing 24 of the shutter of the oven apparatus.

Figure 4B:
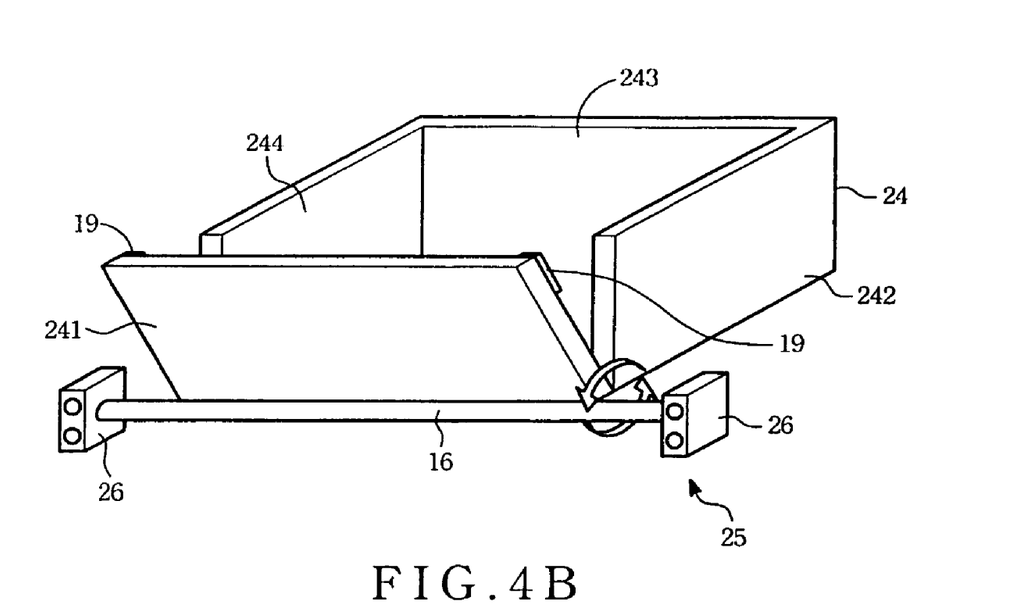

The open device 25 includes a rotating shaft 16 and a driver 26, wherein the rotating shaft 16 is disposed at one of the other two sides of the front face 241 which side is perpendicular to the side edge of the first face 242 or of the second face 244 contacted with the front face 241, and the driver 26 is disposed at one end of the rotating shaft 16. A fixed axle 18 is mounted at the other end of the rotating shaft 16. In another embodiment, another driver 26 is mounted at the other end of the rotating shaft 16, as shown in FIG. 4B.

In the embodiment of this invention, the driver 26 is a rotative gas cylinder or another appropriate driver such as a rotative motor.

Thus, the front face 241 of the housing 24 of the shutter is driven by the driver 26 to open rotatedly. According to this invention, the location and driving direction of the open device 25 depend on the manners of opening of the front face 241. For instance, when the lifted direction of the front face 241 is from top to bottom as the arrow shown in FIG. 4A, the rotating shaft 16 and the driver 26 of the open device 25 can be mounted at the lower side of the front face 241 which is perpendicular to the side edge of the first face 242 contacted with the front face 241, as shown in FIG. 4A.

Figure 5B:
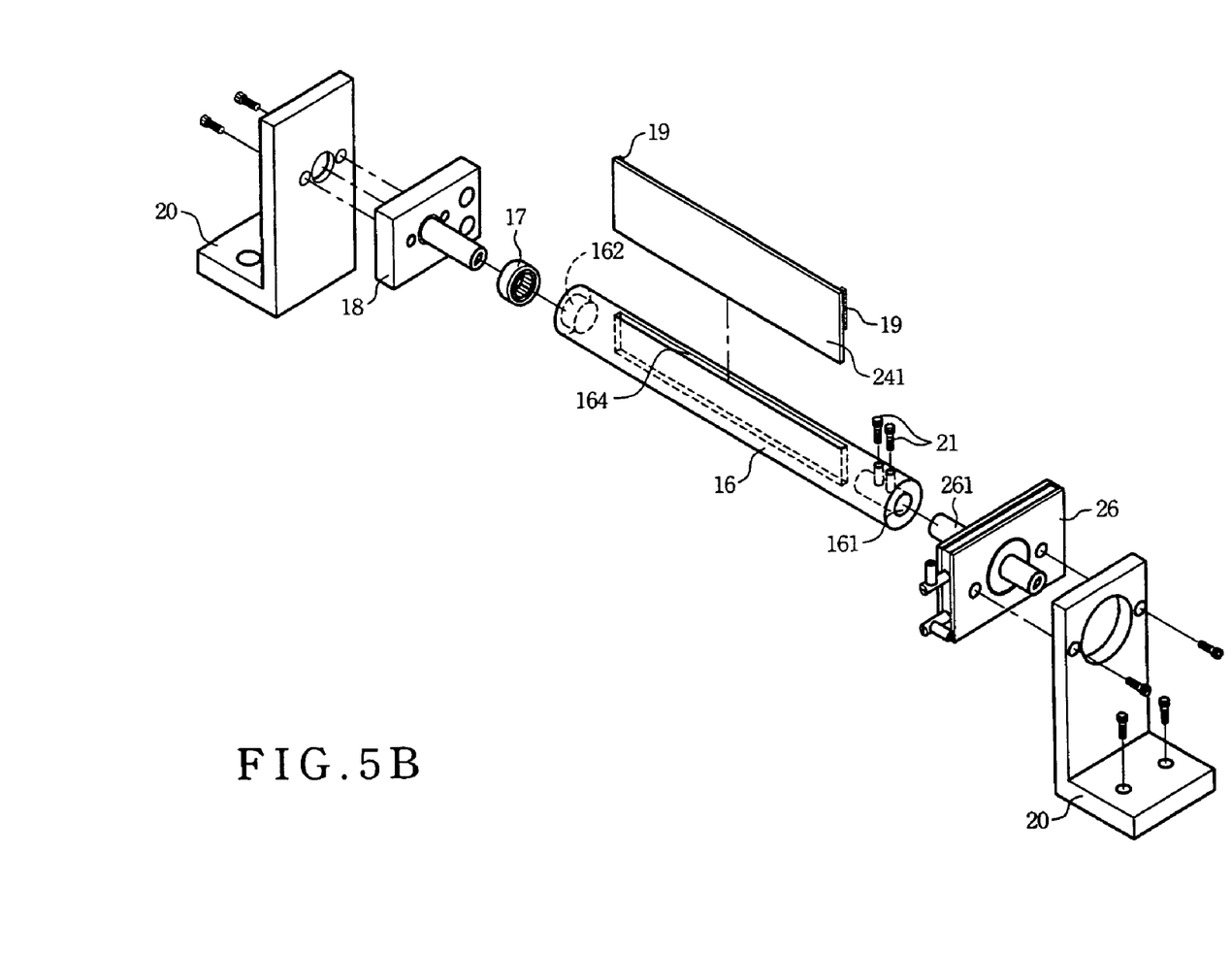

FIG. 5A is an exploded diagram showing the connection of the front face 241 of the shutter, the rotating shaft 16, the rotative gas cylinder driver 26 and the fixed axle 18 in accordance with the preferred embodiment of this invention. The rotating shaft 16 has a concave 163 for receiving the lower side of the front face 241 of the shutter 24. The front face 241 is fixed onto the rotating shaft 16 by a plurality of connecting elements 21 such as bolts, spiral shafts, rivets or other fixing components. Alternatively, the rotating shaft 16 can have a channel 164 (shown in FIG. 5B) in which the lower side of the front face 241 can be inserted.

One end of the rotating shaft 16 has one recess 161 for receiving a rotation axis 261 of the rotative gas cylinder 26 and a plurality of connecting elements 21 such as bolts, spiral shafts, rivets or other fixing components are used to connect the rotative gas cylinder 26 with the rotating shaft 16. Furthermore, the other end of the rotating shaft 16 has another recess 162 for receiving a bearing 17. The fixed axle 18 is connected with the bearing 17 so as to rotate with the rotating shaft 16 driven by the rotative gas cylinder 26. Hence, the front face 241 fixed onto the rotating shaft 16 is accompanied with a lift.

The rotative gas cylinder 26 and the fixed axle 18 are respectively fixed by a respective fastened base 20 on the bottom plate (not shown) of the oven apparatus Preferably, a heat-resistant rubber 19 can be disposed at one respective edge of the other two sides of the front face 241 respectively adjacent to the first face 242 and the second face 244 so as to enhance the airtightness of the shutter 24 and to be a buffer which can prevent contact of the front face 241 with the first face 242 and the second face 244 from friction and impact resulting in particles when the front face 241 is lifted.

In this preferred embodiment, the control sensor and the nitrogen gas line of the original linear-motion gas cylinder in FIG. 1 can be directly transplanted to the rotative gas cylinder 26 for operation, and thus no additional manufacturing cost or a complex pipeline design is needed.

Figure 6A:
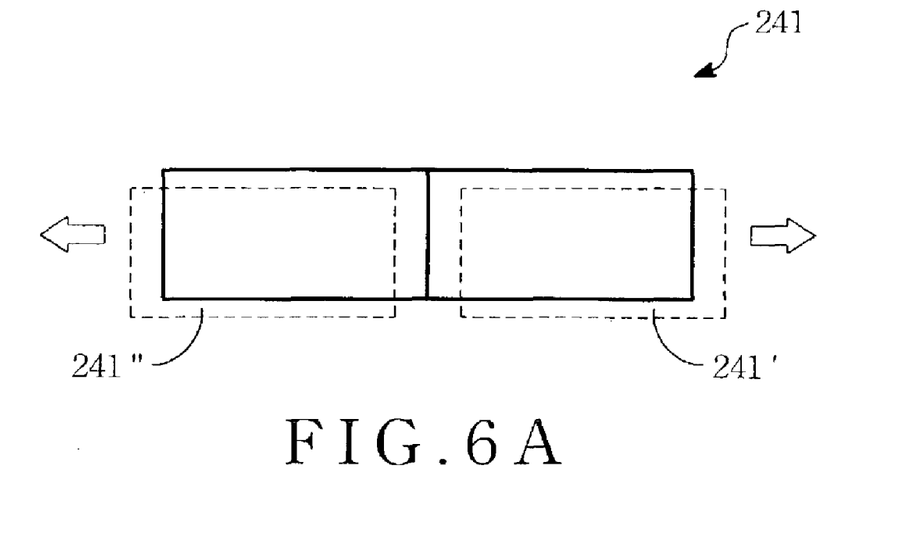
FIGS. 6A, 6B, 7A and 7B are schematic diagrams showing the construction and motion of the front face including a first front face and a second front face in another embodiment of the present invention.
Figure 6B:
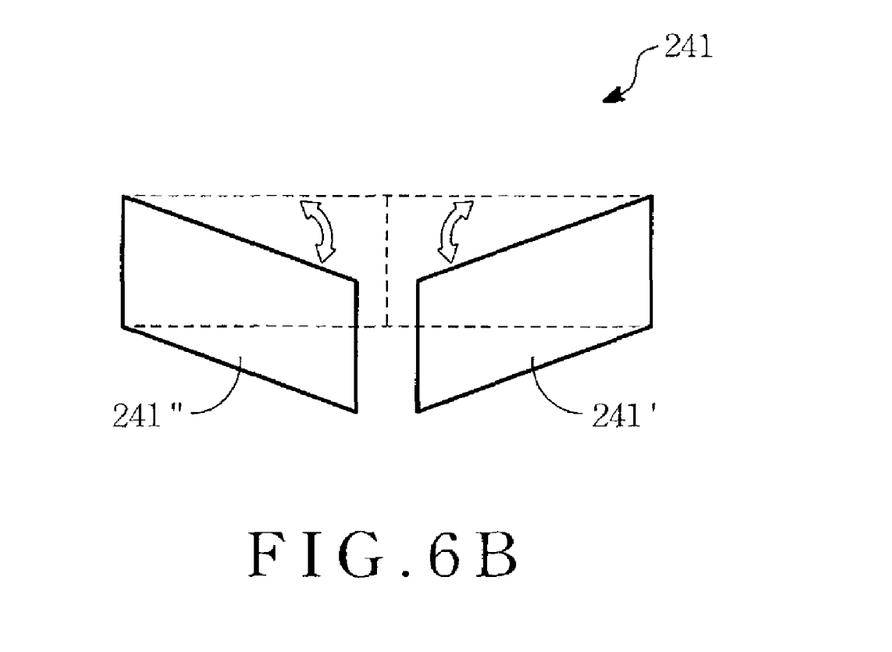
Figure 7A:
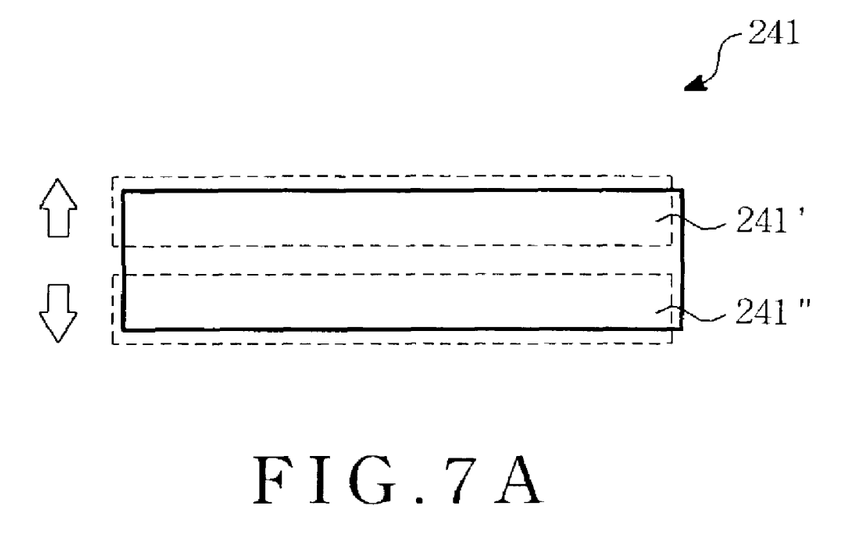
Figure 7B:
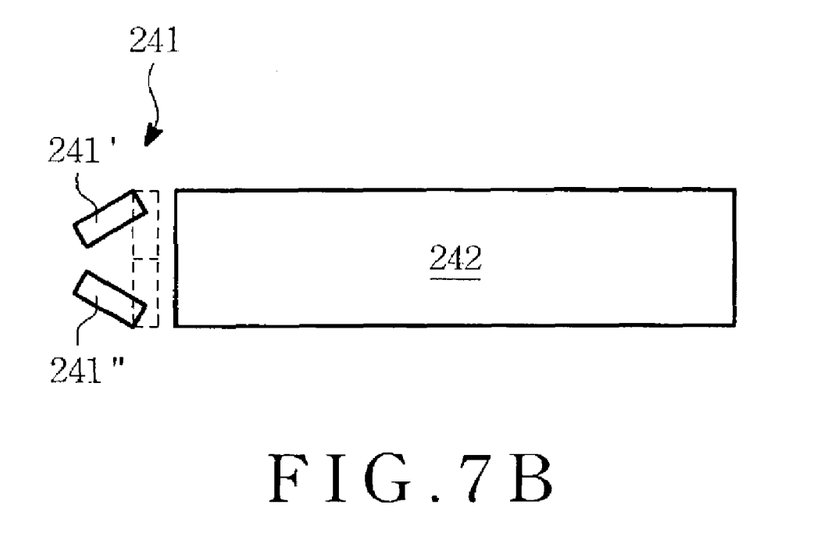

In another embodiment of this invention, the front face 241 of the shutter can include a first front face 241' and a second front face 241", wherein the first front face 241' and the second front face 241" may be a right-left disposition (as shown in FIGS. 6A and 6B) or a top-bottom disposition (as shown in FIGS. 7A and 7B). The first front face 241' and the second frontface 241" have one respective open device (not shown) and are opened by appropriate drivers of the open devices. Similarly, the location and driving direction of the open devices depend on the manners of opening of the first front face 241' and the second front face 241".

When the first front face 241' and the second front face 241" of the front face 241 are opened right-and-left as well as up-and-down, as the dotted line and arrow shown in FIGS. 6A and 7A, a linear-motion gas cylinder can be employed as the drivers. When the first front face 241' and the second front face 241" of the front face 241 are rotatedly opened front-and-rear, as the line and arrow shown in FIGS. 6B and 7B, a rotative gas cylinder can be employed as the drivers.

By means of the improved shutter structure of the oven apparatus of this invention, not only the temperature of the oven apparatus is kept stable and the temperature variation is maintained in ±1° C. so as to increase the reliability of products, but also the pollution particles resulted from friction and collision of the shutter with the surrounding structural elements are prevented and the quality of products is not unfavorably influenced.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed:

1. A shutter structure of an oven apparatus mainly applied in semiconductor or liquid crystal display (LCD) processes, comprising:

a hollow housing, which includes a front face, a first face, a second face and a rear face, wherein edges of two sides of said rear face are respectively connected with one respective side edge of said first face and said second face, and said front face is opposite to said rear face and is structurally separable at least with said first face and with said second face; and an open device, which includes a rotating shaft and a driver, wherein said rotating shaft is disposed at one side of said front face, and said driver is disposed at one end of said rotating shaft and used to drive said front face of said housing to open rotatedly so as to have a substrate placed into said housing and taken out from said housing, wherein said rotating shaft has a concave for receiving said side of said front face of said housing.

2. The shutter structure of claim 1, wherein said driver is a rotative gas cylinder.

3. The shutter structure of claim 1, wherein said driver is a rotative motor.

4. The shutter structure of claim 1, wherein one fixed axle is disposed at the other end of said rotating shaft.

5. The shutter structure of claim 1, wherein another driver is disposed at the other end of said rotating shaft.

6. The shutter structure of claim 1, further comprising a heat-resistant rubber disposed at one respective edge of two sides of said front face respectively adjacent to said first face and said second face.

7. A shutter structure of an oven apparatus mainly applied in semiconductor or liquid crystal display (LCD) processes, comprising:
   a hollow housing, which includes a front face having a first front face and a second front face, a first face, a second face and a rear face, wherein edges of two sides of said rear face are respectively connected with one respective side edge of said first face and said second face, and said front face is opposite to said rear face and is structurally separable at least with said first face and with said second face;
   a first open device, which is disposed at one side of said first front face; and
   a second open device, which is disposed at one side of said second front face;
   wherein said first open device and said second open device respectively include a rotating shaft and a driver, and are used to respectively drive said first front face and said second front face to open rotatedly so as to have a substrate placed into said housing and taken out from said housing, wherein said rotating shafts respectively has a concave for receiving said side of said first front face and said second front face of said housing.

8. A shutter structure of an oven apparatus mainly applied in semiconductor or liquid crystal display (LCD) processes, comprising:
   a hollow housing, which includes a front face, a first face, a second face and a rear face, wherein edges of two sides of said rear face are respectively connected with one respective side edge of said first face and said second face, and said front face is opposite to said rear face and is structurally separable at least with said first face and with said second face; and
   an open device, which includes a rotating shaft and a driver, wherein said rotating shaft is disposed at one side of said front face, and said driver is disposed at one end of said rotating shaft and used to drive said front face of said housing to open rotatedly so as to have a substrate placed into said housing and taken out from said housing,
   wherein said rotating shaft has a channel in which said side of said front face of said housing is inserted.

9. The shutter structure of claim 8, wherein said driver is a rotative gas cylinder.

10. The shutter structure of claim 8, wherein said driver is a rotative motor.

11. The shutter structure of claim 8, wherein one fixed axle is disposed at the other end of said rotating shaft.

12. The shutter structure of claim 8, wherein another driver is disposed at the other end of said rotating shaft.

13. The shutter structure of claim 8, further comprising a heat-resistant rubber disposed at one respective edge of two sides of said front face respectively adjacent to said first face and said second face.

* * * * *